United States Patent
Chen et al.

(10) Patent No.: US 6,916,702 B2
(45) Date of Patent: Jul. 12, 2005

(54) GATE PROCESS AND GATE STRUCTURE FOR AN EMBEDDED MEMORY DEVICE

(75) Inventors: Shih-Ming Chen, Miaoli County (TW); Hsiao-Ying Yang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/951,763

(22) Filed: Sep. 29, 2004

(65) Prior Publication Data

US 2005/0042811 A1 Feb. 24, 2005

Related U.S. Application Data

(62) Division of application No. 10/627,749, filed on Jul. 28, 2003, now abandoned.

(51) Int. Cl.[7] .................... H01L 21/8247; H01L 21/00
(52) U.S. Cl. ...................................... 438/241; 438/258
(58) Field of Search .......................... 438/241, 257–267

(56) References Cited

U.S. PATENT DOCUMENTS

| | | | |
|---|---|---|---|
| 6,258,667 B1 * | 7/2001 | Huang | 438/258 |
| 6,509,235 B2 * | 1/2003 | Chien et al. | 438/275 |
| 6,589,841 B1 | 7/2003 | Pham et al. | |
| 6,670,227 B1 | 12/2003 | Thio et al. | |
| 6,798,015 B2 * | 9/2004 | Kasuya | 257/316 |
| 2002/0132458 A1 * | 9/2002 | Chien et al. | 438/593 |

* cited by examiner

*Primary Examiner*—Richard A. Booth
(74) *Attorney, Agent, or Firm*—Birch, Stewart, Kolasch & Birch, LLP

(57) ABSTRACT

A gate process and a gate process for an embedded memory device. A semiconductor silicon substrate has a memory cell area and a logic circuit area. A first dielectric layer is formed overlying the semiconductor silicon substrate, and then a gate structure is formed overlying the first dielectric layer of the memory cell area. Next, a protective layer is formed overlying the first dielectric layer and the top and sidewall of the gate structure. Next, an insulating spacer is formed overlying the protective layer disposed overlying the sidewall of the gate structure. Next, a pre-cleaning process is performed to remove the protective layer and the first dielectric layer overlying the logic circuit area. Next, a second dielectric layer is formed overlying the logic circuit area, and then a gate layer is formed overlying the second dielectric layer of the logic circuit area.

10 Claims, 8 Drawing Sheets

GATE PROCESS AND GATE STRUCTURE FOR AN EMBEDDED MEMORY DEVICE

This application is a Divisional of application Ser. No. 10/627,749, filed on Jul. 28, 2003, now abandoned, and for which priority is claimed under 35 U.S.C. §120; the entire contents of all are hereby incorporated by reference.

BACKGROUND OF THE INVENTION

1. Field of the Invention

The invention relates to an embedded memory device, and more particularly to a gate process and a gate structure of an embedded memory device in order to prevent damage to a tunnel oxide and a dielectric structure in a memory array area in a subsequent cleaning process for removing a native oxide layer.

2. Description of the Related Art

An embedded memory device, called a SOC (system on a chip) device, integrates memory cells and logic circuits on the same substrate, in which the memory data stored in the memory area is operated by logic circuits. Currently in the semiconductor industry, a DRAM (dynamic random access memory) cell, an SRAM (static random access memory) cell, and a flash memory cell are extensively used in embedded memory devices.

The flash memory cell comprises a floating gate for storing charge and a control gate for controlling the voltage of a world line, in which the voltages of the word line and source/drain electrodes are coordinated to control the charge-stored capacity of the floating gate and determine the on/off state of a transistor. Thus, the flash memory is also called an erasable programmable read only memory (EPROM). In a conventional gate process for the flash memory device, a tunnel oxide film is formed between a silicon substrate and a floating gate, and then an ONO dielectric structure and a control gate are successively formed on the floating gate. The quality control of the tunnel oxide film is one important factor in the operating speed of the flash memory. In many approaches for combining the memory process and the standard logic process, however, the formation of a gate oxide in the peripheral logic area causes damage to the tunnel oxide in the memory area, thus deteriorating the electrical performance of the flash memory.

FIGS. 1A to 1D are cross-sections illustrating a conventional gate process for an embedded memory device. In FIG. 1A, a semiconductor silicon substrate 10 is provided with a memory cell area I and a logic circuit area II. First, a first silicon oxide layer 12 is grown on the semiconductor silicon substrate 10, and then a gate structure 20 used for a flash memory device is formed on the memory cell area I. The gate structure 20 comprises a floating gate layer 14, an ONO dielectric layer 16 and a control gate layer 18. Thus, the first silicon oxide layer 12 sandwiched between the gate structure 20 and the semiconductor silicon substrate 10 serves as a tunnel oxide layer 12a. Next, in FIG. 1B, using deposition and dry etching, a silicon oxide spacer 22 is formed on the sidewall of the gate structure 20.

Next, in FIG. 1C, a pre-cleaning process is performed on the semiconductor silicon substrate 10 to remove the first silicon oxide layer 12 outside the gate structure 20. Next, in FIG. 1D, a thermal oxidation process is employed to grow a second silicon oxide layer 24 on the entire surface of the substrate 10. Finally, using deposition, photolithography and etching, a gate layer 26 is formed on the second silicon oxide layer 24 within the logic circuit area II, in which the second silicon oxide layer 24 sandwiched between the gate layer 26 and the substrate 10 serves as a gate oxide layer 24a.

The pre-cleaning process is used to remove a native oxide layer from the logic circuit area II, which is beneficial for the subsequent gate oxide process. In dipping the substrate 10 into an etching solution used in the pre-cleaning process, however, the etching solution damage the silicon oxide spacer 22, even the tunnel oxide layer 12a and the ONO dielectric layer 16, thus losing control of the thickness and film quality of the tunnel oxide layer 12a. Accordingly, a novel gate process for preventing damage to the tunnel oxide layer 12a and the ONO dielectric layer 16 in the subsequent cleaning process is called for.

SUMMARY OF THE INVENTION

Accordingly, an object of the present invention is to provide a gate process and a gate process for an embedded memory device, which can prevent damage to a tunnel dielectric layer and a dielectric structure on a memory cell area from a subsequent pre-cleaning process for removing a native oxide layer.

According to the object of the invention, a gate process includes the following steps. A semiconductor silicon substrate has a memory cell area and a logic circuit area. A first dielectric layer is formed on the semiconductor silicon substrate, and then a gate structure is formed on the first dielectric layer of the memory cell area. Next, a protective layer is formed on the first dielectric layer and the top and sidewall of the gate structure. Next, an insulating spacer is formed on the protective layer disposed on the sidewall of the gate structure. Next, a pre-cleaning process is performed to remove the protective layer and the first dielectric layer on the logic circuit area. Next, a second dielectric layer is formed on the logic circuit area, and then a gate layer is formed on the second dielectric layer of the logic circuit area.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings, which are given by way of illustration only and thus not intended to be limitative of the present invention, and wherein.

DETAILED DESCRIPTION OF THE INVENTION

The prevent invention provides a gate process and a gate structure for an embedded memory device in order to prevent damage to a tunnel oxide layer in a subsequent cleaning process for removing a native oxide layer. The present invention is applied to an integrated process for combining a memory cell and logic circuits, in which the memory device is a DRAM cell or a flash memory cell.

Figure 1A:
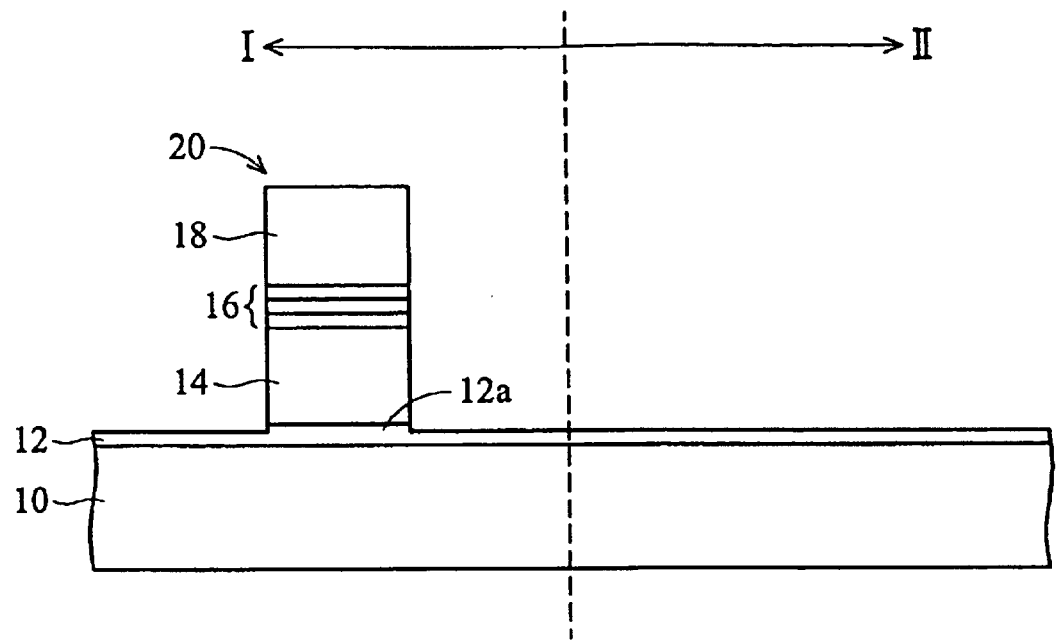
FIGS. 1A to 1D are cross-sections illustrating a conventional gate process for an embedded memory device.
Figure 1B:
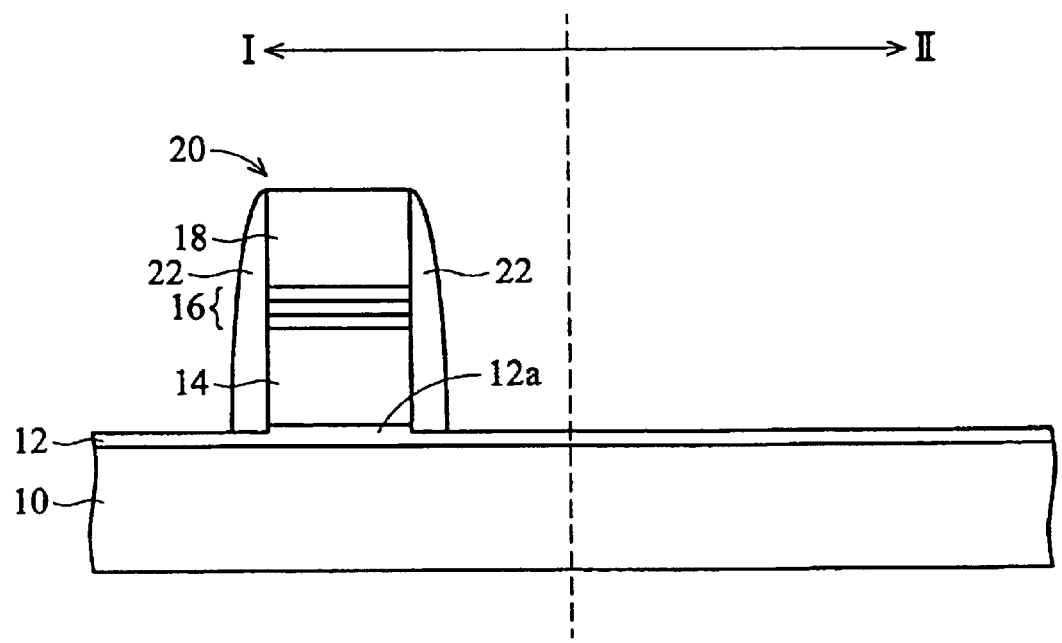
Figure 1C:
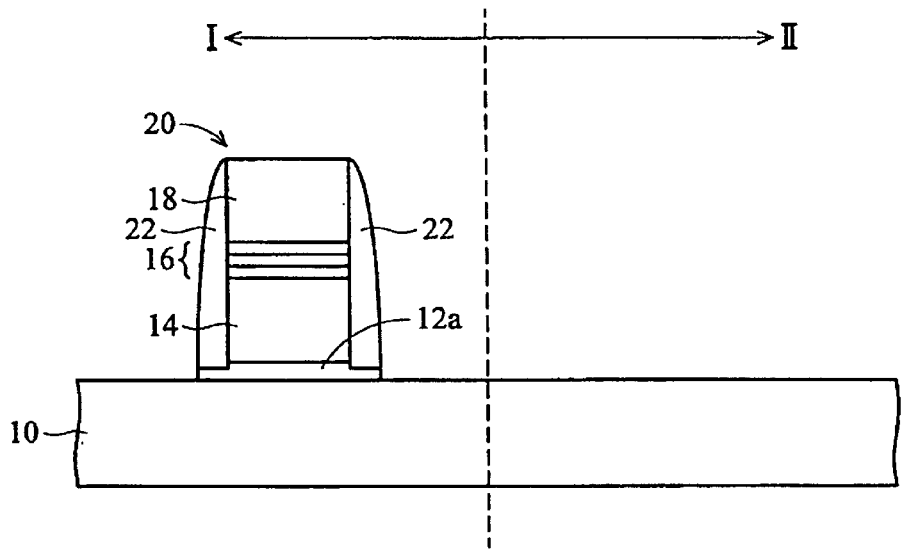
Figure 1D:
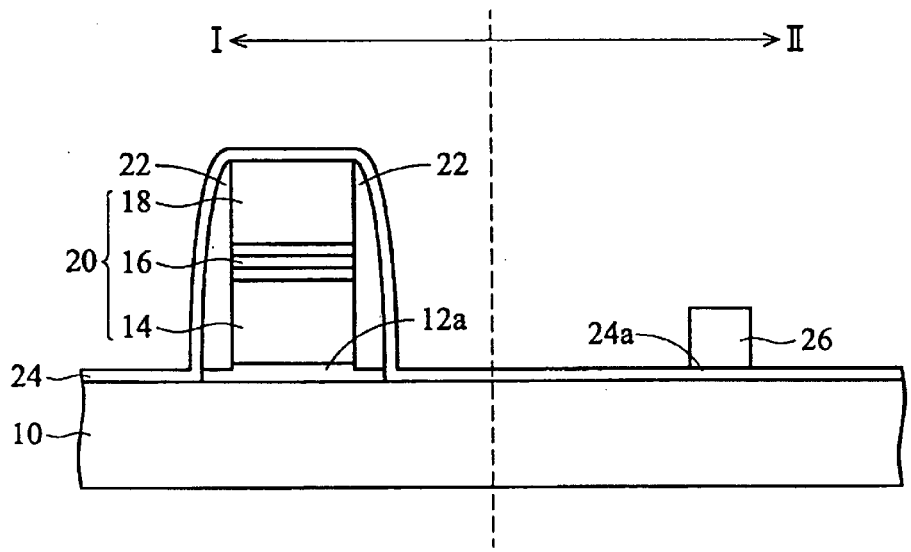
Figure 2A:
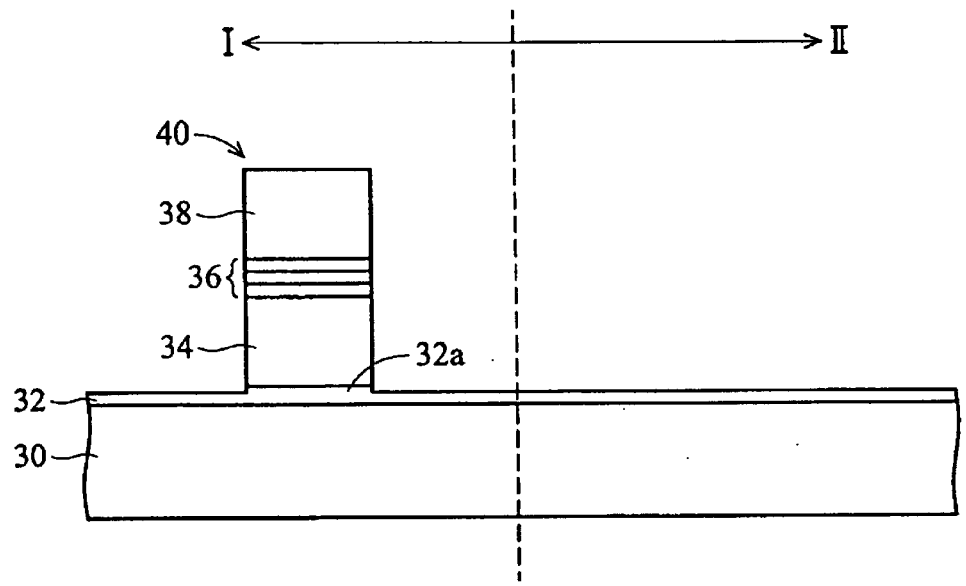
FIGS. 2A to 2L are cross-sections illustrating a gate process for an embedded memory device according to the present invention.

FIGS. 2A to 2L are cross-sections illustrating a gate process for an embedded memory device according to the present invention. In FIG. 2A, a semiconductor silicon substrate 30 is provided with a memory cell area I and a logic circuit area II. First, a first dielectric layer 32 is formed on the semiconductor silicon substrate 30. Preferably, a thermal oxidation process is employed to grow a silicon oxide layer on the semiconductor silicon substrate 30. Then, using deposition, photoresist pattern transfer and dry etching, a gate structure 40 used for a flash memory device is formed on the memory cell area I. Thus, the first dielectric layer 32 sandwiched between the gate structure 40 and the substrate 30 serves as a tunnel dielectric layer 32a. The gate structure 40 comprises a first conductive layer 34 formed on the tunnel dielectric layer 32a, a dielectric structure 36 formed on the first conductive layer 34, and a second conductive layer 38 formed on the dielectric structure 36. Preferably, the first conductive layer 34 is a polysilicon layer, the dielectric structure 36 is an ONO (oxide-nitride-oxide) dielectric structure, and the second conductive layer 38 is a polysilicon layer.

Figure 2B:
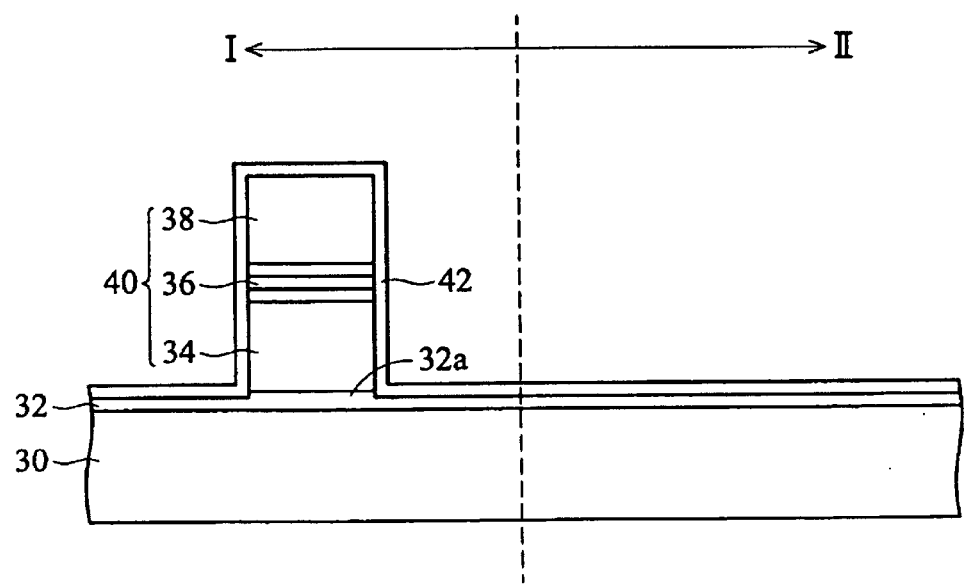

Next, in FIG. 2B, a protective layer 42 is formed on the entire surface of the semiconductor silicon substrate 30 to cover the gate structure 40 and the tunnel dielectric layer 32a. Preferably, a thermal oxidation process is employed to conformally deposit a silicon oxide layer with a thickness of 50~500 Å. Alternatively, a CVD (chemical vapor deposition) process or an LPCVD (low pressure CVD) process is employed to conformally deposit a silicon nitride layer with a thickness of 50~500 Å.

Figure 2C:
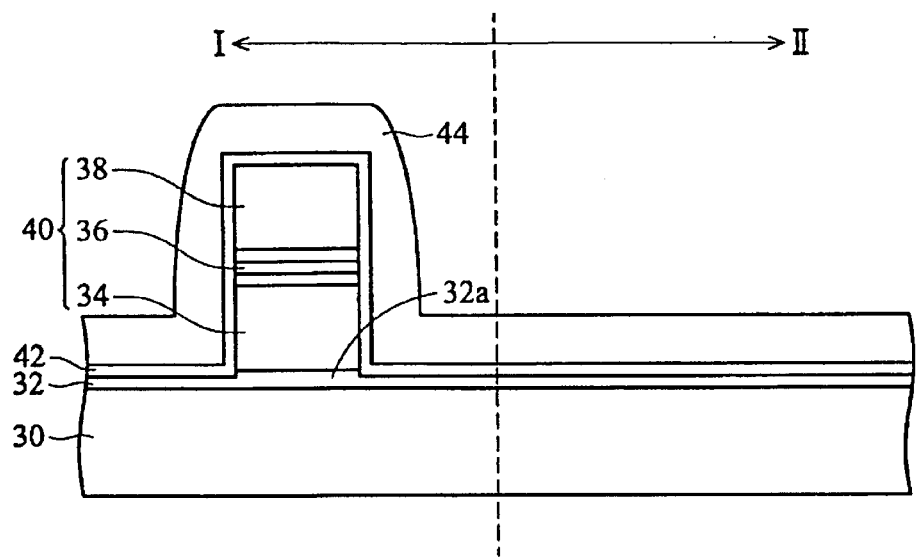
Figure 2D:
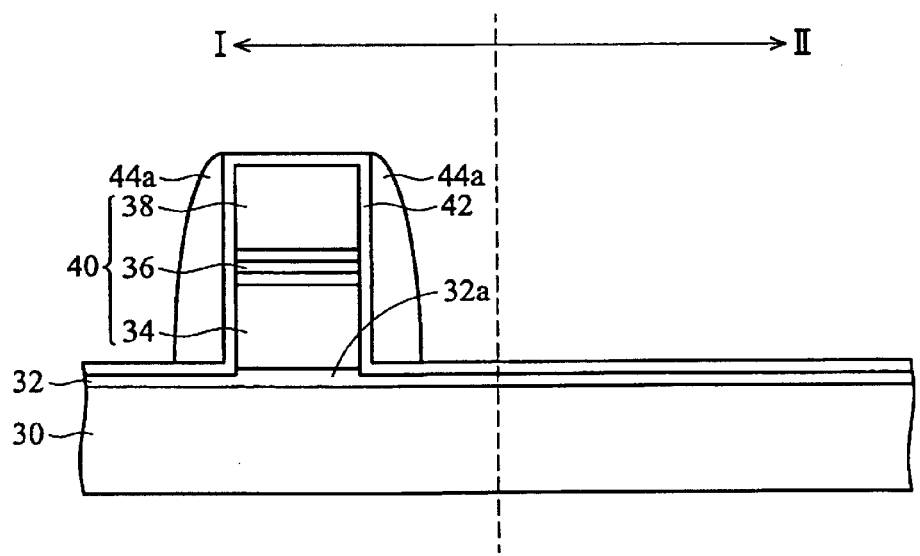

Next, in FIG. 2C, an insulating layer 44 is formed to cover the entire surface of the semiconductor silicon substrate 30. Preferably, a PECVD (plasma enhanced CVD) process or an LPCVD process is employed with TEOS (tetra ethyl ortho silicate) as the precursor to form a silicon oxide layer with a thickness of 50~500 Å. Alternatively, a PECVD process or an LPCVD process is employed to conformally deposit a silicon nitride layer with a thickness of 50~500 Å. Next, in FIG. 2D, dry etching is employed to remove the insulating layer 44 outside the sidewall of the gate structure 40, thus the insulating layer 44 remaining on the protective layer 42 on the sidewall of the gate structure 40 serves as a insulating spacer 44a.

Figure 2E:
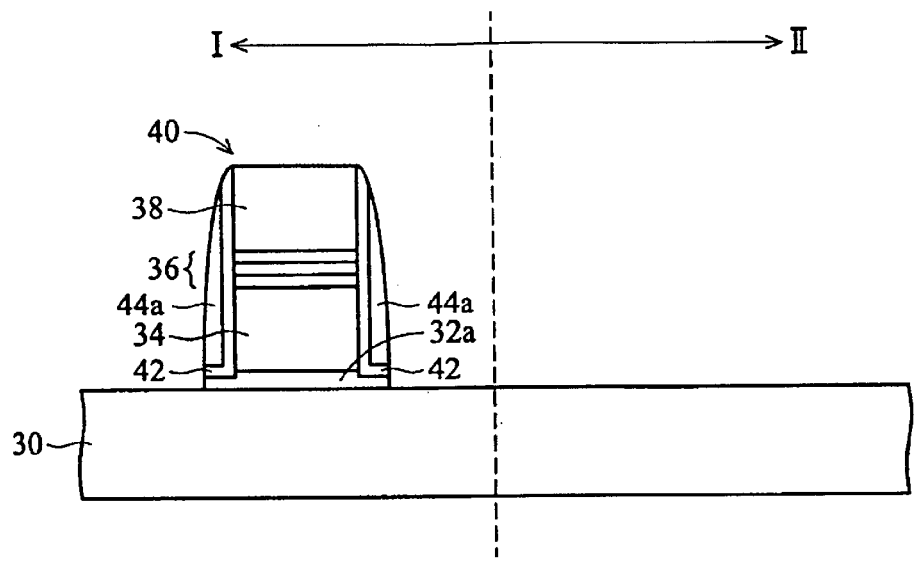

After completing the tunnel dielectric layer 32a, the gate structure 40 and the insulating spacer 44a within the memory cell area I, another gate process for the logic circuit area II is now described. In FIG. 2E, a pre-cleaning process is performed on the semiconductor silicon substrate 30 to remove the native oxide layer within the logic circuit area II, which is favorable for a subsequent gate oxide process. Preferably, the semiconductor silicon substrate 30 is dipped into an etching solution to remove the exposed regions of the first dielectric layer 32 and the protective layer 42. Although the etching solution damage a portion of the insulating spacer 44a, and even a portion of the protective layer 42 underneath the insulating spacer 44a, the protective layer 42 still effectively prevents damage to the tunnel dielectric layer 32a and the dielectric structure 36 from the etching solution. This ensures the thickness and film quality of the tunnel dielectric layer 32a and the dielectric structure 36.

Figure 2F:
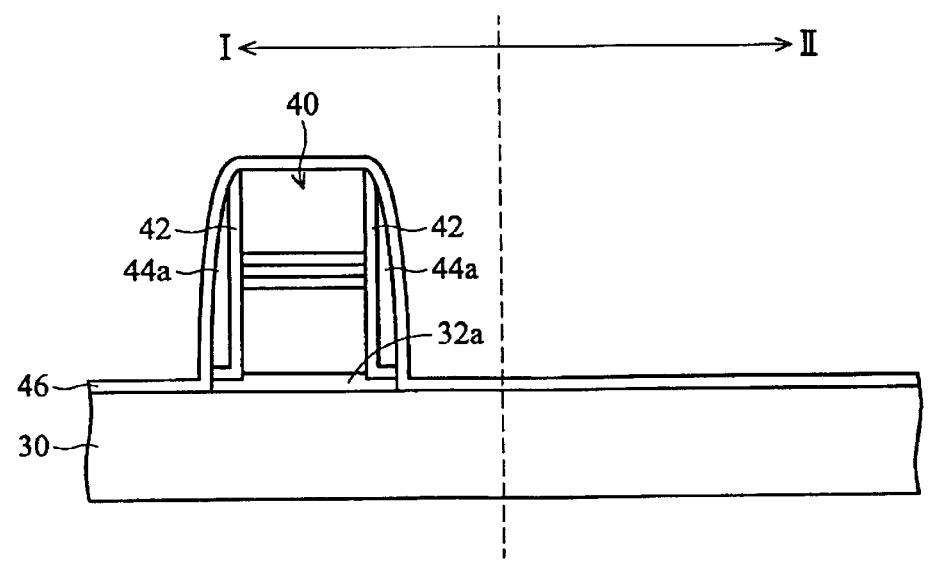

Next, in FIG. 2F, a second dielectric layer 46 is formed on the entire surface of the semiconductor silicon substrate 30. Preferably, a thermal oxidation process is employed to grow a silicon oxide layer to cover the gate structure 40 on the memory cell area I and the surface of the semiconductor silicon substrate 30 on the logic circuit area II.

Figure 2G:
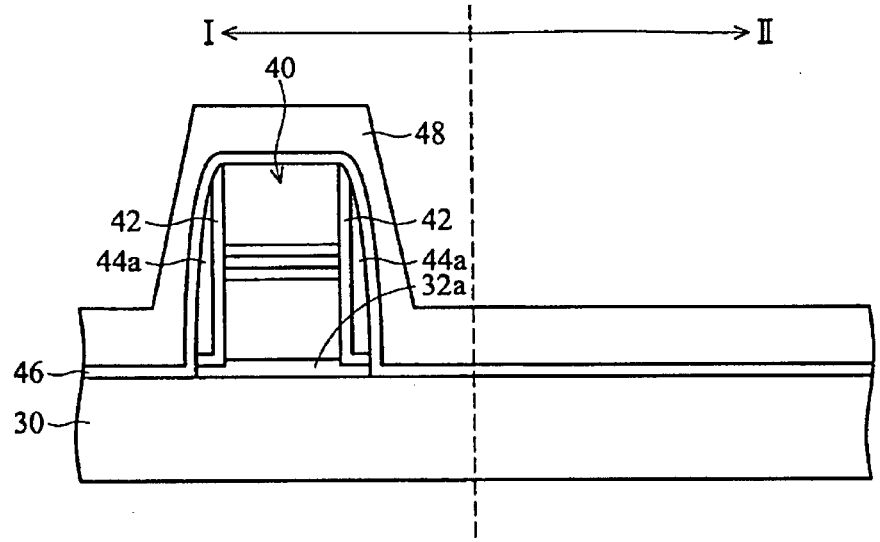
Figure 2H:
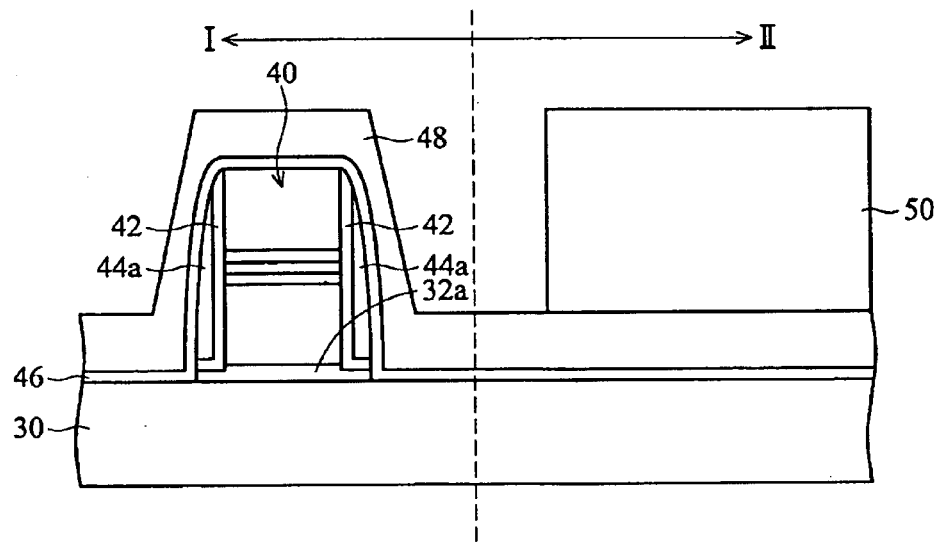
Figure 2I:
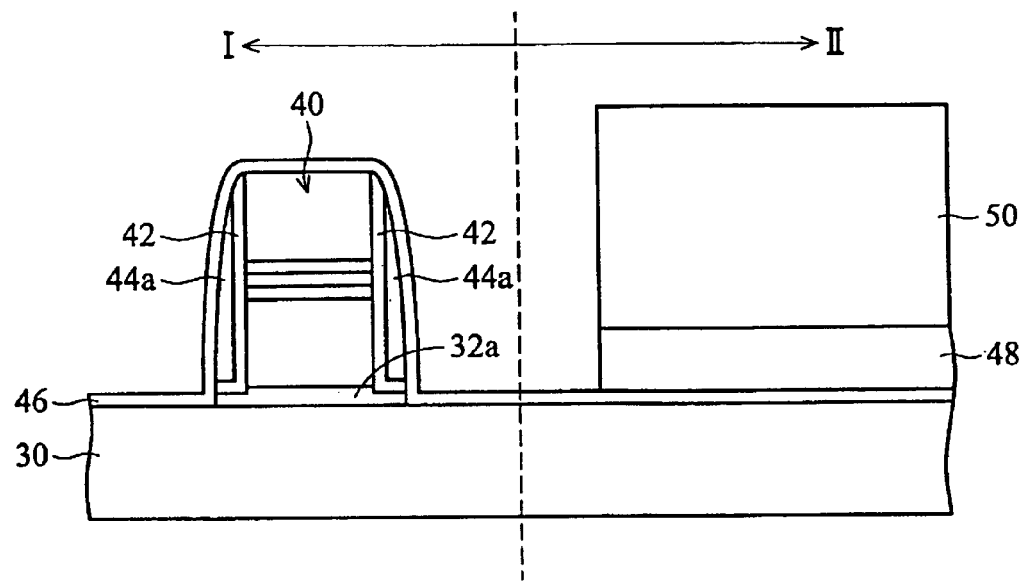
Figure 2J:
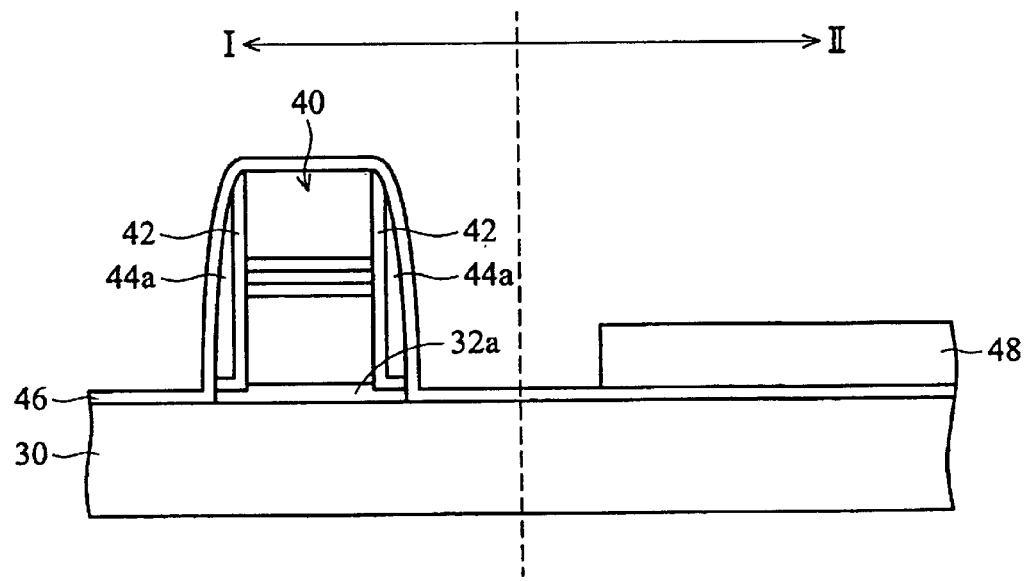

Thereafter, in FIG. 2G, a third conductive layer 48 is deposited on the second dielectric layer 46. Preferably, an LPCVD process is employed to deposit a polysilicon layer on the second dielectric layer 46. Next, in FIG. 2H, a first photoresist layer 50 is formed to cover the third conductive layer 48 on the logic circuit area II, thus exposing the third conductive layer 48 on the memory cell area I. Next, in FIG. 2I, using the first photoresist layer 50 as a mask, the third conductive layer 48 is etched away from the memory cell area I is removed. Then, in FIG. 2J, the first photoresist layer 50 is removed, thus the third conductive layer 48 is merely patterned on the logic circuit area II.

Figure 2K:
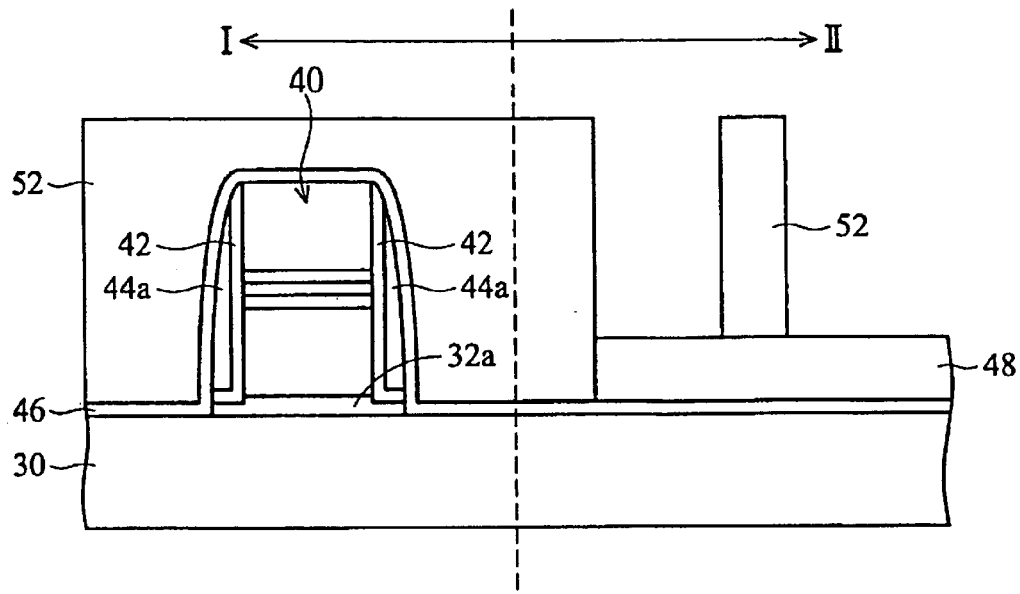
Figure 2L:
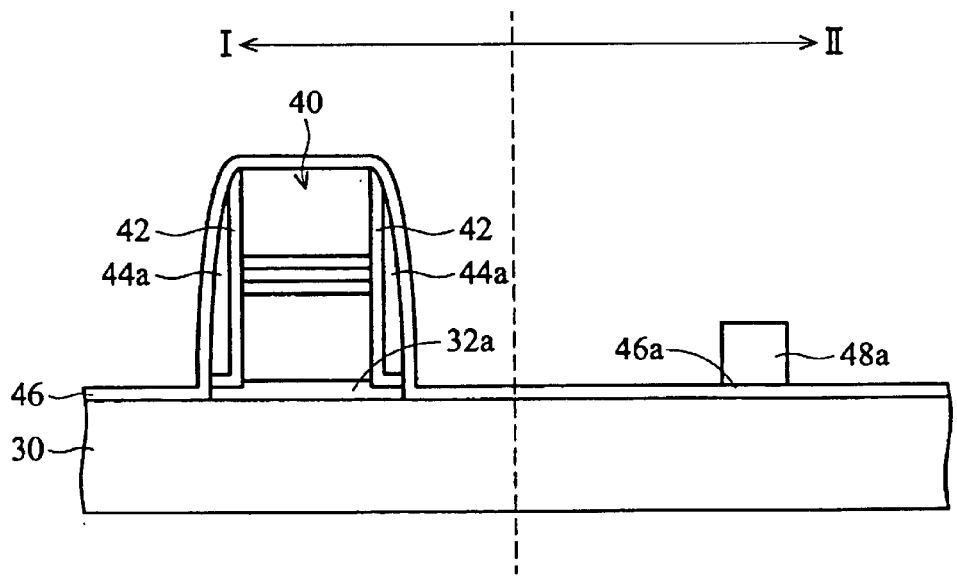

Finally, in FIG. 2K, a second photoresist layer 52 is formed to cover the memory cell area I and has a pattern corresponding to a gate layer on the logic circuit area II. Next, in FIG. 2L, the exposed region of the third conductive layer 48 is removed, and then the second photoresist layer 52 is removed. Thus, in the logic circuit area II, the third conductive layer 48 serves as a gate layer 48a, and the second dielectric layer 46 sandwiched between the gate layer 48a and the semiconductor silicon substrate 30 serves as a gate dielectric layer 46a.

Compared with the conventional method, the present invention provides the protective layer 42 on the top and sidewall of the gate structure 40 prior to the formation of the insulating spacer 44a, thus the protective layer 42 prevents damage to the tunnel dielectric layer 32a and the dielectric structure 36 in the subsequent pre-cleaning process. This sustains the thickness and film quality of the tunnel dielectric layer 32a and the dielectric structure 36 to ensure the electrical performance of the embedded memory device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A gate process for an embedded memory device, comprising the steps of:

providing a semiconductor silicon substrate having a memory cell area and a logic circuit area;

forming a first dielectric layer overlying the semiconductor silicon substrate;

forming a gate structure overlying the first dielectric layer of the memory cell area;

forming a protective layer overlying the first dielectric layer and the top and sidewall of the gate structure;

forming an insulating spacer overlying the protective layer disposed overlying the sidewall of the gate structure;

performing a pre-cleaning process to remove the protective layer and the first dielectric layer overlying the logic circuit area;

forming a second dielectric layer overlying the logic circuit area; and forming a gate layer overlying the second dielectric layer of the logic circuit area.

2. The gate process for an embedded memory device as claimed in claim 1, wherein the memory cell area comprises a flash memory cell or a DRAM cell.

3. The gate process for an embedded memory device as claimed in claim 1, wherein the first dielectric layer is a silicon oxide layer.

4. The gate process for an embedded memory device as claimed in claim 1, wherein the gate structure overlying the memory cell area comprises:

a floating gate layer formed overlying the first dielectric layer of the memory cell area;

a dielectric structure formed overlying the floating gate layer; and a control gate layer formed overlying the dielectric structure.

5. The gate process for an embedded memory device as claimed in claim 1, wherein the protective layer is a silicon oxide layer or a silicon nitride layer.

6. The gate process for an embedded memory device as claimed in claim 1, wherein the protective layer has a thickness of 50~500 Å.

7. The gate process for an embedded memory device as claimed in claim 1, wherein the pre-cleaning process removes the protective layer and the first dielectric layer disposed outside the insulating spacer overlying the memory cell area.

8. The gate process for an embedded memory device as claimed in claim 1, wherein the second dielectric layer is a silicon oxide layer.

9. The gate process for an embedded memory device as claimed in claim 1, wherein the second dielectric layer is formed overlying the memory cell area.

10. The gate process for an embedded memory device as claimed in claim 1, wherein the formation of the gate layer overlying the logic circuit area comprising the steps of:

depositing a conductive layer overlying the second dielectric layer;

forming a first photoresist layer overlying the conductive layer to cover the logic circuit area;

etching the conductive layer overlying the memory cell area;

removing the first photoresist layer;

forming a second photoresist layer to cover the memory cell area and has a pattern corresponding to the gate layer overlying the logic circuit area;

removing the exposed conductive layer, in which the conductive layer remaining overlying the logic circuit area serves as the gate layer; and removing the second photoresist layer.

* * * * *